(12) United States Patent
Pax

(10) Patent No.: US 7,180,797 B2
(45) Date of Patent: *Feb. 20, 2007

(54) REDUCED POWER REGISTERED MEMORY MODULE AND METHOD

(75) Inventor: George E. Pax, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/202,808

(22) Filed: Aug. 12, 2005

(65) Prior Publication Data

US 2006/0028904 A1    Feb. 9, 2006

Related U.S. Application Data

(63) Continuation of application No. 10/815,878, filed on Mar. 30, 2004, now Pat. No. 7,072,231, which is a continuation of application No. 10/165,821, filed on Jun. 7, 2002, now Pat. No. 6,731,548.

(51) Int. Cl.
*G11C 7/00* (2006.01)

(52) U.S. Cl. .................. 365/189.12; 365/233; 365/240

(58) Field of Classification Search ........... 365/189.12, 365/189.08, 191, 233, 240
See application file for complete search history.

(56) References Cited

U.S. PATENT DOCUMENTS

| | | | |
|---|---|---|---|
| 3,359,827 A | 12/1967 | Kirsch | 365/230 |
| 5,262,998 A | 11/1993 | Mnich et al. | 365/222 |
| 5,400,289 A | 3/1995 | Blodgett | 365/222 |
| 5,450,364 A | 9/1995 | Stephens, Jr. et al. | 365/222 |
| 5,627,791 A | 5/1997 | Wright et al. | 365/222 |
| 5,636,173 A | 6/1997 | Schaefer | 365/230.03 |
| 5,787,489 A | 7/1998 | Pawlowski | 711/169 |
| 5,831,467 A | 11/1998 | Leung et al. | 327/319 |
| 5,841,726 A | 11/1998 | Williams et al. | 365/230.03 |
| 5,848,431 A | 12/1998 | Pawlowski | 711/5 |
| 5,881,016 A | 3/1999 | Kenkare et al. | 365/230.03 |
| 5,901,101 A | 5/1999 | Suzuki et al. | 365/222 |
| 5,949,657 A | 9/1999 | Karabatsos | 361/803 |
| 6,014,340 A | 1/2000 | Sawada | 365/233 |
| 6,031,782 A | 2/2000 | Kobashi et al. | 365/228 |
| 6,049,502 A | 4/2000 | Cowles et al. | 365/230.03 |
| 6,115,278 A | 9/2000 | Deneroff et al. | 365/52 |
| 6,172,928 B1 | 1/2001 | Ooishi | 365/222 |

(Continued)

*Primary Examiner*—Richard Elms
*Assistant Examiner*—Hien N Nguyen
(74) *Attorney, Agent, or Firm*—Dorsey & Whitney, LLP

(57) ABSTRACT

A registered memory module includes a plurality of flip-flops having respective data terminals, respective clock terminals receiving a clock signal and output terminals coupled to a plurality of SDRAM devices in the module. A logic gate decodes respective chip select signals for selecting the SDRAM devices. The logic gate generates an enable signal if a memory access is being directed to any of the SDRAM devices in the module. In one embodiment, the flip-flops include an enable input coupled to receive the enable signal from the logic gate. In another embodiment, the input signals are coupled to the data inputs of the flip-flops through logic gates that are selectively enabled by the enable signal from the logic gate. As a result, the input signals are not latched by transitions of the clock signal when a memory access is not directed to any of the SDRAM devices in the module.

51 Claims, 5 Drawing Sheets

U.S. PATENT DOCUMENTS

| | | |
|---|---|---|
| 6,185,656 B1 | 2/2001 | Pawlowski .................. 711/104 |
| 6,188,641 B1 | 2/2001 | Uchida ....................... 365/233 |
| 6,205,514 B1 | 3/2001 | Pawlowski .................. 711/104 |
| 6,215,686 B1 | 4/2001 | Deneroff et al. ............... 365/52 |
| 6,215,714 B1 | 4/2001 | Takemae et al. ............ 365/222 |
| 6,233,195 B1 | 5/2001 | Yamazaki et al. ...... 365/230.03 |
| 6,243,777 B1 | 6/2001 | Pawlowski .................. 710/107 |
| 6,249,185 B1 | 6/2001 | O'Toole et al. ............. 330/261 |
| 6,253,298 B1 | 6/2001 | Pawlowski .................. 711/169 |
| 6,253,340 B1 | 6/2001 | Cowles et al. .............. 714/718 |
| 6,292,412 B1 | 9/2001 | Kato et al. ................... 365/194 |
| 6,292,420 B1 | 9/2001 | Kim et al. ................... 365/222 |
| 6,304,497 B1 | 10/2001 | Roohparvar ............ 365/194.04 |
| 6,304,510 B1 | 10/2001 | Nobunaga et al. ..... 365/230.06 |
| 6,310,819 B1 | 10/2001 | Cowles et al. ......... 365/230.06 |
| 6,339,552 B1 | 1/2002 | Taruishi et al. ........ 365/189.05 |
| 6,349,068 B2 | 2/2002 | Takemae et al. ............ 365/222 |
| 6,351,404 B1 | 2/2002 | Wright et al. ................. 365/51 |
| 6,359,827 B1 | 3/2002 | Kirsch ................... 365/230.06 |
| 6,370,662 B2 | 4/2002 | Hamidi ....................... 714/724 |
| 6,373,752 B1 | 4/2002 | Wright et al. .......... 365/189.05 |
| 6,414,894 B2 | 7/2002 | Ooishi et al. ................ 365/222 |
| 6,438,055 B1 | 8/2002 | Taguchi et al. ............. 365/222 |
| 6,449,203 B1 | 9/2002 | Cowles et al. .............. 365/222 |
| 6,456,542 B1 | 9/2002 | Roohparvar ........... 365/189.12 |
| 6,483,347 B1 | 11/2002 | Baker .......................... 326/82 |
| 6,499,073 B1 | 12/2002 | Wallach et al. ............. 710/103 |
| 6,504,787 B2 | 1/2003 | Tsubouchi et al. ...... 365/230.05 |
| 6,510,099 B1 | 1/2003 | Wilcox et al. ......... 365/230.06 |
| 6,525,981 B2 | 2/2003 | Ryan .......................... 365/223 |
| 6,529,429 B2 | 3/2003 | Cowles et al. .............. 365/201 |
| 6,538,473 B2 | 3/2003 | Baker .......................... 326/82 |
| 6,549,479 B2 | 4/2003 | Blodgett ..................... 365/222 |
| 6,552,596 B2 | 4/2003 | Cowles et al. .............. 327/318 |
| 6,552,955 B1 | 4/2003 | Miki ........................... 365/233 |
| 6,560,158 B2 | 5/2003 | Choi et al. .................. 365/226 |
| 6,570,804 B1 | 5/2003 | Blodgett .................... 365/225.7 |
| 6,580,659 B1 | 6/2003 | Roohparvar ................. 365/233 |
| 6,597,617 B2 | 7/2003 | Ooishi et al. ................ 365/222 |
| 6,606,269 B2 | 8/2003 | Roohparvar ........... 365/185.33 |
| 6,731,548 B2 * | 5/2004 | Pax ........................ 365/189.12 |
| 6,771,553 B2 | 8/2004 | Cowles et al. .............. 365/222 |

* cited by examiner

REDUCED POWER REGISTERED MEMORY MODULE AND METHOD

CROSS-REFERENCE TO RELATED APPLICATIONS

This application is a continuation of U.S. patent application Ser. No. 10/815,878, filed Mar. 30, 2004 now U.S. Pat. No. 7,072,231; which is a continuation of U.S. patent application Ser. No. 10/165,821, filed Jun. 7, 2002, issued as U.S. Pat. No. 6,731,548.

TECHNICAL FIELD

The invention relates to dynamic random access memory devices, and, more particularly, to a method and system for reducing the power consumed by registered memory modules.

BACKGROUND OF THE INVENTION

Dynamic random access memory ("DRAM") devices are commonly used in a wide variety of applications. One of the most common use for DRAM devices is as system memory in personal computers. The speed and capacity demands on DRAM devices continues to increase in this and other applications. However, power is consumed each time a digital circuit is switched to change the state of a signal line. The rate at which power is consumed by DRAM devices therefore increases with both the capacity and the operating speed of the devices. Thus, the demands for ever increasing memory capacities and speeds are inconsistent with the demands for ever decreasing memory power consumption.

For many applications, it is particularly important to limit the power consumption of DRAM devices. For example, DRAM devices used as system memory in portable personal computers should consume relatively little power to allow a battery to power the computer over an extended period. The limited period over which electronic devices, such as portable computers, can operated has been addressed by both attempts to increase battery life and attempts to reduce the rate at which such devices consume power. Excessive power consumption can also create problems even where DRAM devices are not powered by batteries. For example, the heat generated by excessive power consumption can damage the DRAM devices, and it can be difficult and/or expensive to maintain the temperature of electronic equipment containing the DRAM devices at an acceptably low value.

Various techniques have been used to reduce power consumption in electronic equipment containing DRAM devices. One approach has been to prevent digital circuits from switching when such circuits are not active since, as mentioned above, power is consumed each time a component in the digital circuit is switched from one state to another. While this approach can significantly reduce the power consumed by DRAM devices, there are circuits in DRAM devices that cannot be rendered inactive without compromising the speed and/or operability of the DRAM devices. For example, a computer system may use several registered DRAM modules 10a–c as shown in FIG. 1. Each module 10 includes two DRAM devices 12, 14, although a greater number of DRAM devices may be included in registered DRAM modules. The DRAM modules 10 also include a register 20 that receives control signals coupled through a control bus 24 and address signals coupled through an address bus 26. These control and address signals are latched in the register 20 responsive to an internal clock ICLK signal. The ICLK signal is generated by a phase-lock loop 34 from an external clock ("CK0") signal, which is applied to the modules 10 though a clock line 35. In one commercially available registered DRAM module, these control signals that are applied to the register include a row address strobe signal ("RAS#") (the "#" indicates the signal is active low), a column address strobe signal ("CAS#"), clock enable signals ("CKE0" and "CKE1"), a write enable signal ("WE#") and chip select signals ("S0#" and "S1#") to activate the DRAM devices 12, 14, respectively. Other signals not latched by the register 20 include the clock CK0 signal, data signals ("DQ0–DQ63") corresponding to a 64-bit data word applied to the modules through a data bus 28, and a number of other signals that are not pertinent to the present discussion. In this commercially available registered DRAM module, bank address signals ("B0–B1") corresponding to a 2-bit bank address and row/column address signals ("A0–A12") corresponding to a 13-bit address are also applied to the register 20 through the address bus 26.

The register 20 used in the registered DRAM modules 10a–c of FIG. 1 is shown in FIG. 2. Each of the control and address signals that are applied to the register 20 are applied to the data input of a respective flip-flop 30. The flip-flops 30 are clocked by an internal clock signal ICLK generated at the output of a phase-lock loop 34. The phase-lock loop 34 receives the clock signal CK0 so that the phase of the internal clock signal ICLK matches the phase of the externally applied clock signal CK0. The use of the phase-lock loop 34 to generate the internal clock signal ICLK avoid excessive loading of the external clock signal CK0 since the clock signal must be applied to a number of circuits in each module 10. The signals applied to the flip-flops 30 are latched on each rising edge of the internal clock signals ICLK.

Returning to FIG. 1, in operation, address signals A0–A12 and the previously mentioned control signals are simultaneously applied to all of the registered DRAM modules 10a–c, and all of these signals are latched into the registers 20 in all of these modules 10a–c. Each module 10a–c receives a different pair of chip select signals that designates which of the modules 10a–c is being accessed. Latching a large number of signals into the flip-flops 30 in each of the several modules 10a–c on each edge of a high speed clock signal can consume a significant amount of power since, as previously mentioned, power is consumed each time a digital circuit switches state. However, only one of the modules 10a–c is selected for a memory access by switching its chip select signals S0# and S1# active low. Therefore, the power consumed by the modules 10a–c that are not being selected for the memory access is unnecessarily consumed. This unnecessary power consumption can be significant since a large number of signals are latched into the registers 20 of each of the inactive modules 10 on each rising edge of the clock signal CLK0, which may have a frequency of 133 mHz or higher.

There is therefore a need for a method and system to prevent power from being needlessly consumed by registered DRAM modules.

SUMMARY OF THE INVENTION

A registered memory module and method includes a register receiving a plurality of signals at respective input terminals. The register stores the input signals responsive to a transition of an internal clock signal applied to a clock terminal of the register when an enable signal is active. The registered memory module also includes a plurality of memory devices coupled to output terminals of the register. Each of the memory devices is selected by a respective select signal being active. A logic circuit in the module receives the select signals for the memory devices and determines if any of the select signals is active indicative of an access to a memory device in the module. If any of the select signals is active, the logic circuit applies an active enable signal to the register. If none of the select signals is active, the logic circuit applies an inactive enable signal to the register. As a result, if a memory access is not directed to a memory device in the module, the register in the module does not consume a significant amount of power by storing signals responsive to transitions of the internal clock signal.

DETAILED DESCRIPTION OF THE INVENTION

Figure 3:
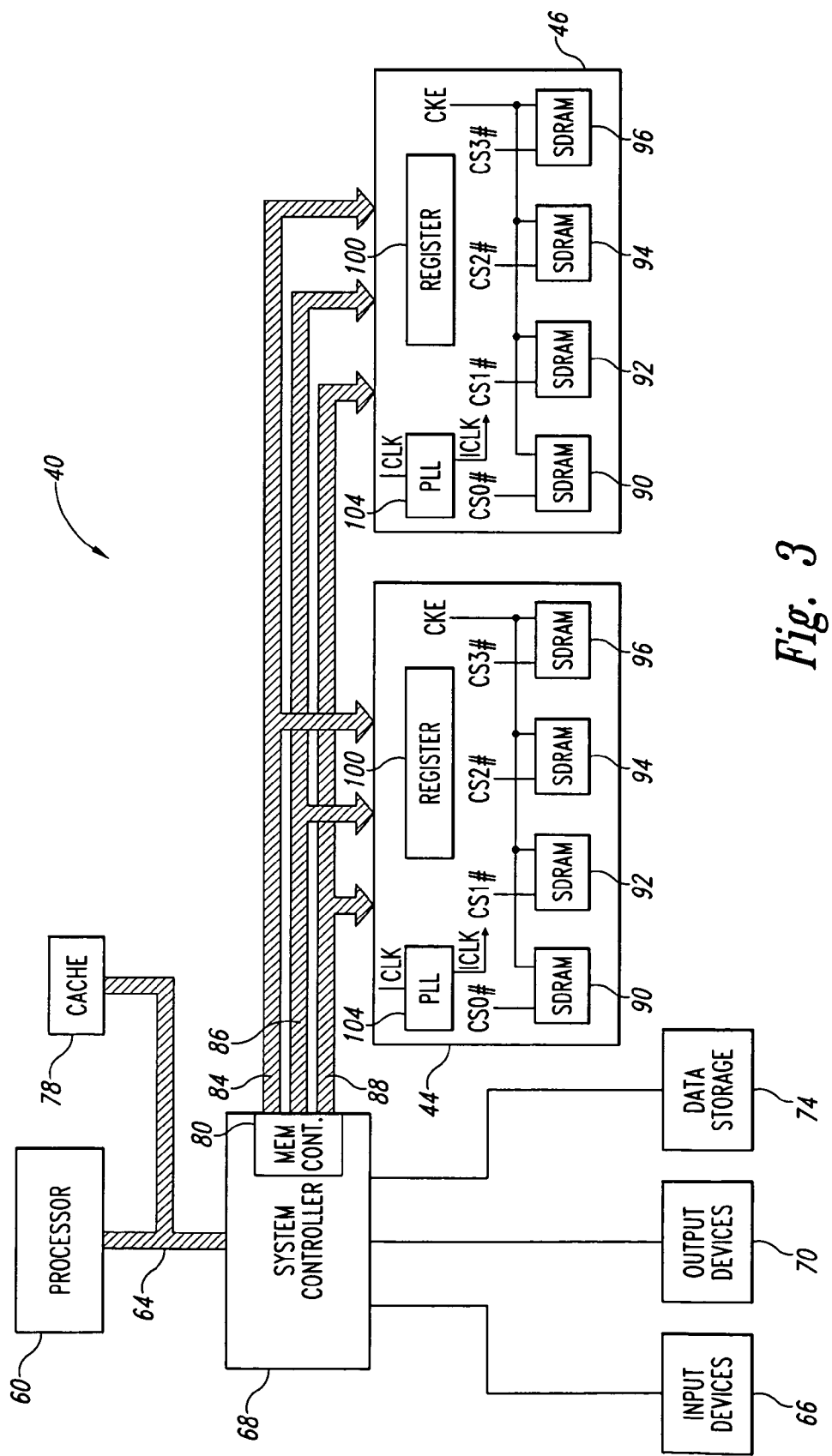
FIG. 3 is a block diagram of a computer system containing several registered DRAM modules according to one embodiment of the invention.

A computer system 40 containing two registered DRAM modules 44, 46 in accordance with one embodiment of the invention is shown in FIG. 3. The computer system 40 includes a processor 60 for performing various computing functions, such as executing specific software to perform specific calculations or tasks. The processor 60 is coupled to a processor bus 64 that normally includes an address bus, a control bus, and a data bus. In addition, the computer system 40 includes one or more input devices 66, such as a keyboard or a mouse, coupled to the processor 60 through a system controller 68 to allow an operator to interface with the computer system 40. Typically, the computer system 40 also includes one or more output devices 70 coupled to the processor 60 through the system controller 68, such output devices typically being a printer or a video terminal. One or more data storage devices 74 are also typically coupled to the processor 60 through the system controller 68 to allow the processor 60 to store data or retrieve data from internal or external storage media (not shown). Examples of typical storage devices 74 include hard and floppy disks, tape cassettes, and compact disk read-only memories (CD-ROMs). The processor 60 is also typically coupled to cache memory 78, which is usually static random access memory ("SRAM"). The system controller 68 also includes a memory controller 80 that is coupled to both of the registered DRAM modules 44, 46 through an address bus 84, a control bus 86 and a data bus 88. Each of the DRAM modules 44, 46 includes four synchronous DRAM ("SDRAM") devices 90, 92, 94, 96 as well as a register 100 and a phase-lock loop ("PLL") 104. Each of the SDRAM devices 90–96 is selected by a respective chip select signal CS0#, CS1#, CS2#, CS3#, all of which are coupled to the registers 100 in the modules 44, 46 through the control bus 86. The control bus 86 also couples a clock enable signal CKE to the SDRAMs 90–96 in the modules 44, 46, and a clock signal CLK to the PLLs 104 in the modules 44, 46. The PLLs 104 generate an internal clock signal ICLK that is synchronized to the externally applied clock signal CLK. The CKE signal is applied to the SDRAM devices 90–96 in the modules 44, 46 through the registers 100. In other types of registered memory modules, such as modules using double data rate ("DDR") DRAMs, it may be necessary for other signals to be applied directly to memory devices in the modules.

Figure 1:
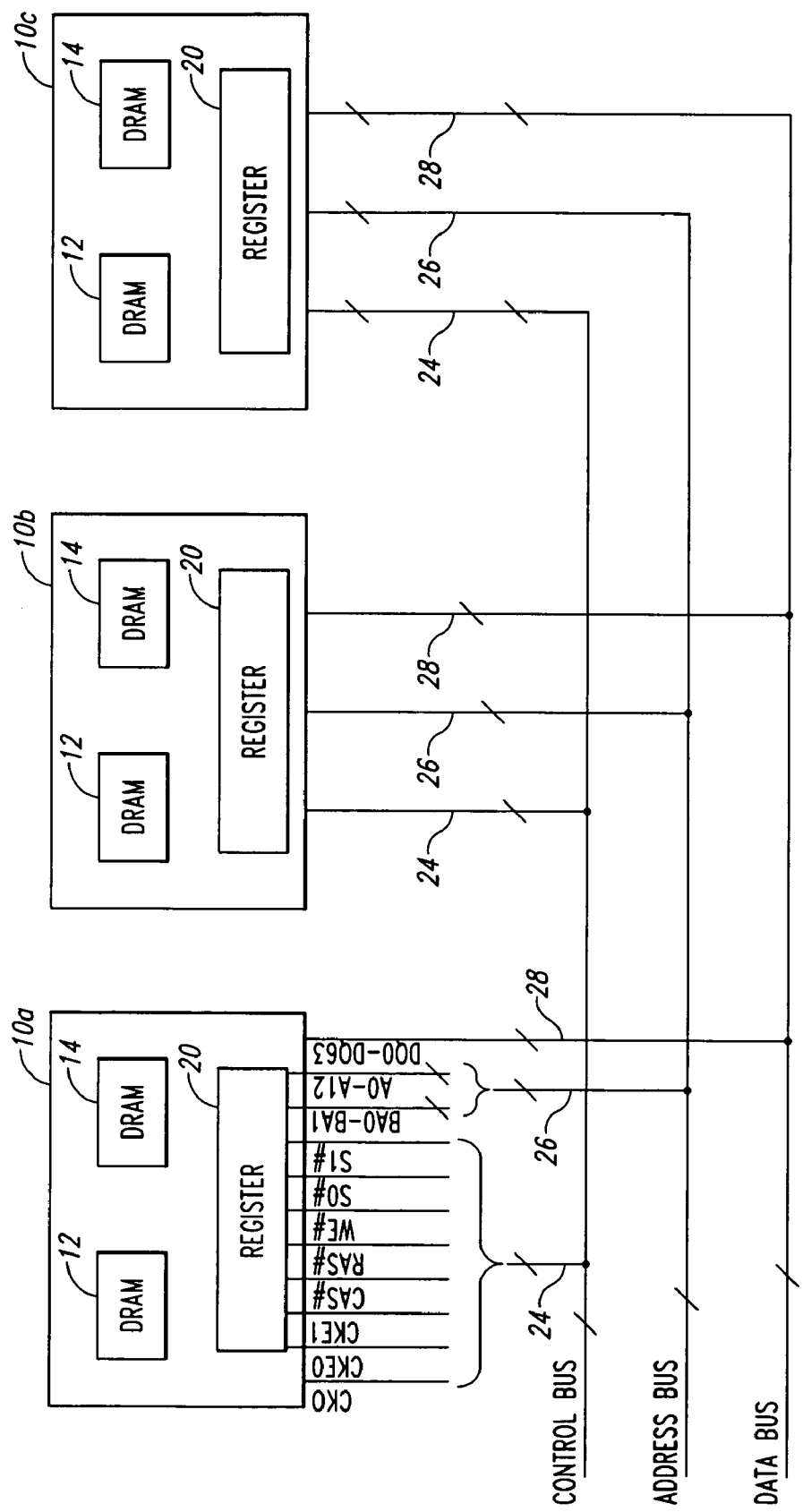
FIG. 1 is a block diagram of a portion of a conventional computer system containing several commercially available registered DRAM modules.
Figure 2:
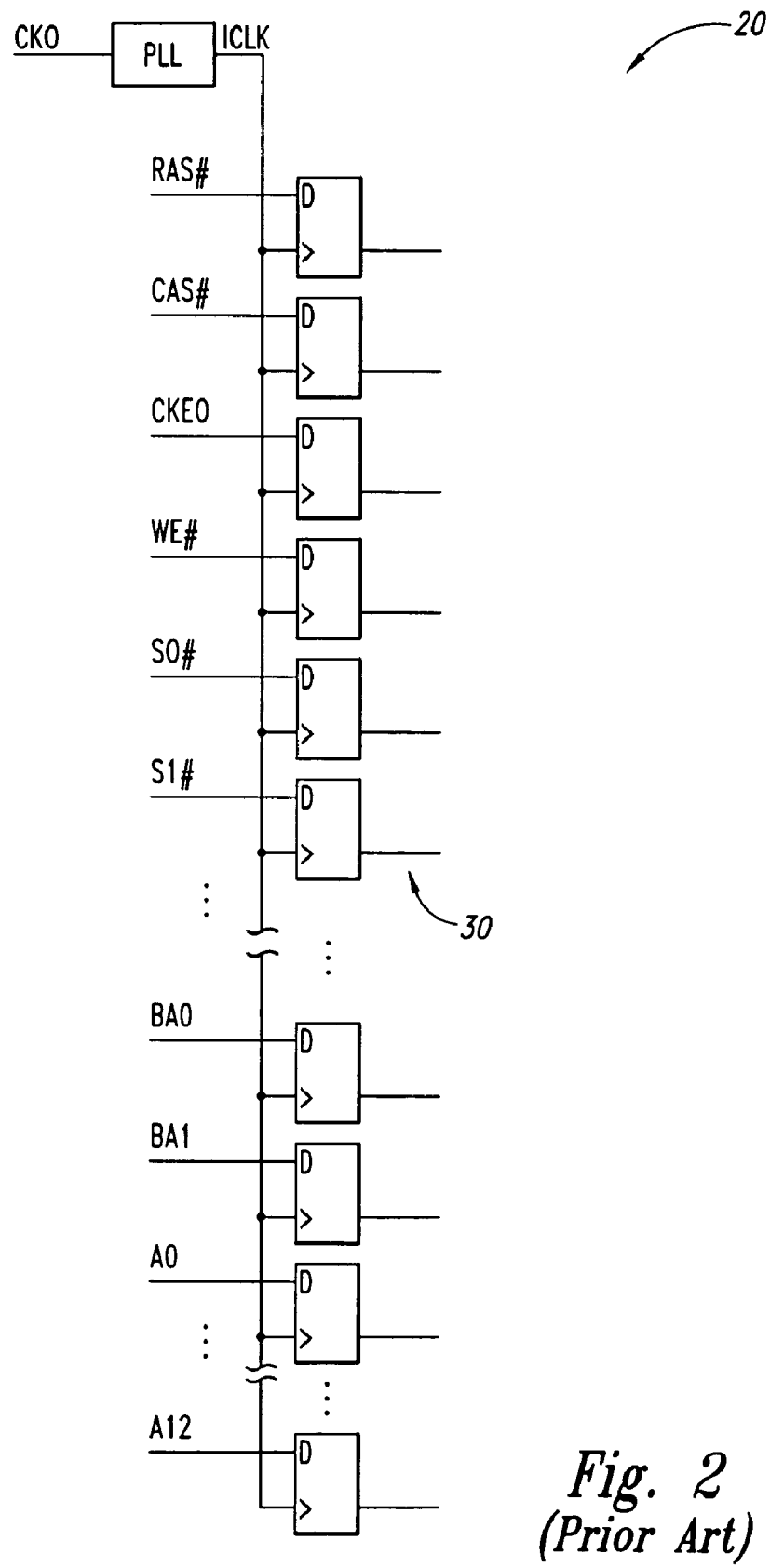
FIG. 2 is a logic diagram of a register used in the conventional registered DRAM module of FIG. 2.
Figure 4:
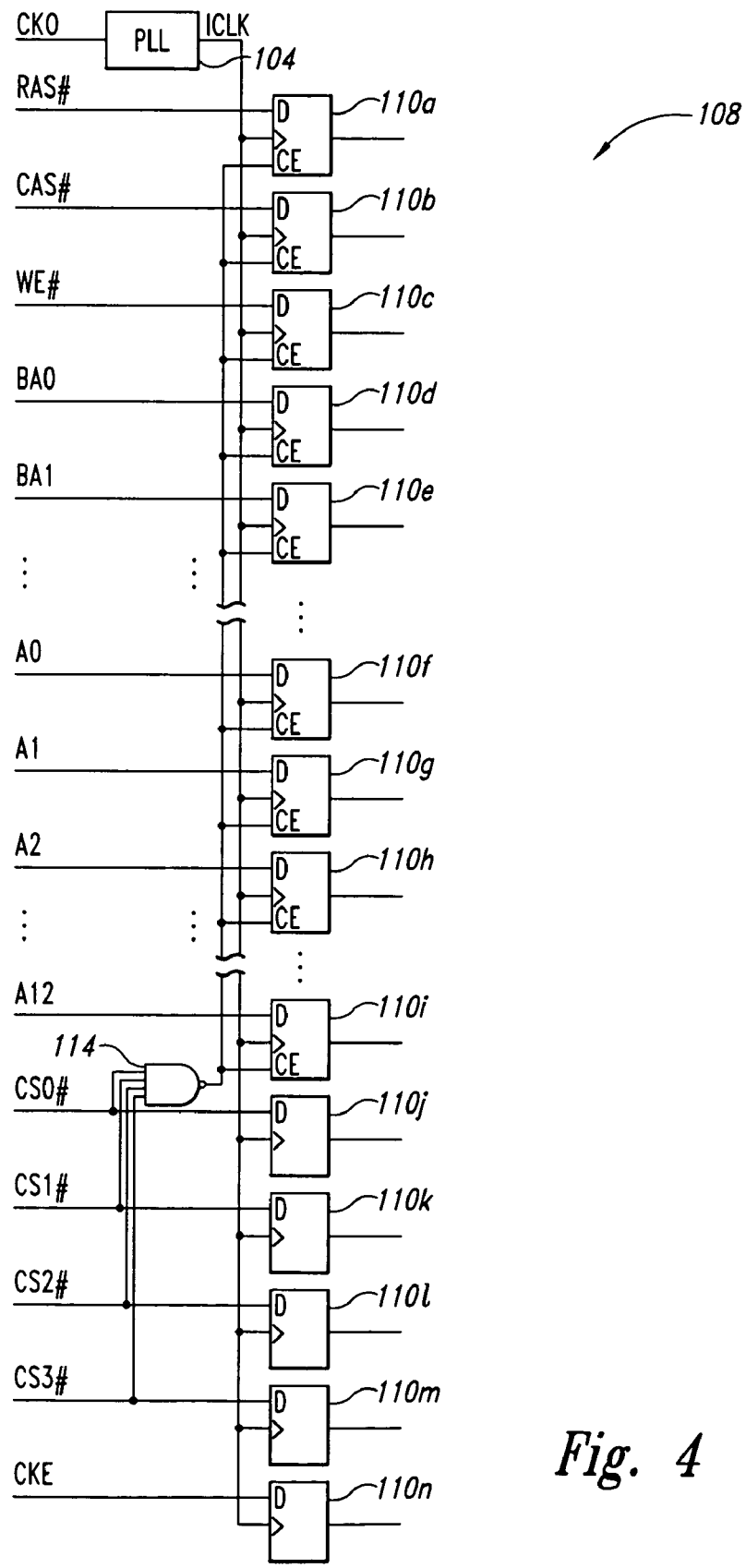
FIG. 4 is a logic diagram of one embodiment of a register used in the registered DRAM module of FIG. 2.

One embodiment of a register 108 that may be used for the registers 100 in the modules 44, 46 is shown in FIG. 4. The register 108 includes a flip-flop 110 for each of the signals that is applied to the register 100. Each flip-flop 110 includes a data "D" input to which the externally applied signal is coupled, a clock input "C" to which the ICLK signal is coupled, and a clock enable "CE" input that receives an enable signal. The enable signal applied to the CE input allow the ICLK signal to latch the signal applied to the D input on a transition, such as the rising edge, of the ICLK signal. The enable signal applied to the CE input is generated by a NAND gate 114 having four inputs that receive the four chip select signals CS0#–CS3#. As mentioned above, the chip select signals CS0#–CS3# are active low. As a result, the output of the NAND gate 114 will be high to enable the flip-flops 110 if any of the chip select signals CS0#–CS3# is active low. Thus, the register 100 in one of the modules 44, 46 will latch the signals applied to its inputs responsive to the ICLK signal if any of the SDRAMs 90–96 in the module 44, 46 is selected by the memory controller 80. Significantly, however, if none of the chip select signals CS0#–CS3# is active low, all of the inputs to the NAND gate 114 will be high, thereby causing the NAND gate 114 to apply a low to the CE inputs of the flip-flops 110. As a result, the flip-flops 110 will not latch the signals applied to their D inputs responsive to the CLK signal. By causing the registers 100 to refrain from responding to the CLK signal if none of the SDRAMs 90–96 in the module 44, 46 is selected, the non-enabled register 44, 46 consumes relatively little power. In contrast, the conventional registered DRAM modules 10a–c shown in FIGS. 1 and 2 continues to consume a significant amount of power even if neither of the DRAM devices 12, 14 in the module 10 has been selected. More specifically, the registers 20 used in the modules 10a–c consume power each time signals are latched into the registers 20 responsive to each leading edge of the clock signal. However, the flip-flops 110j–100n that receive the chip select signals CS0#–CS3# are always enabled.

Figure 5:
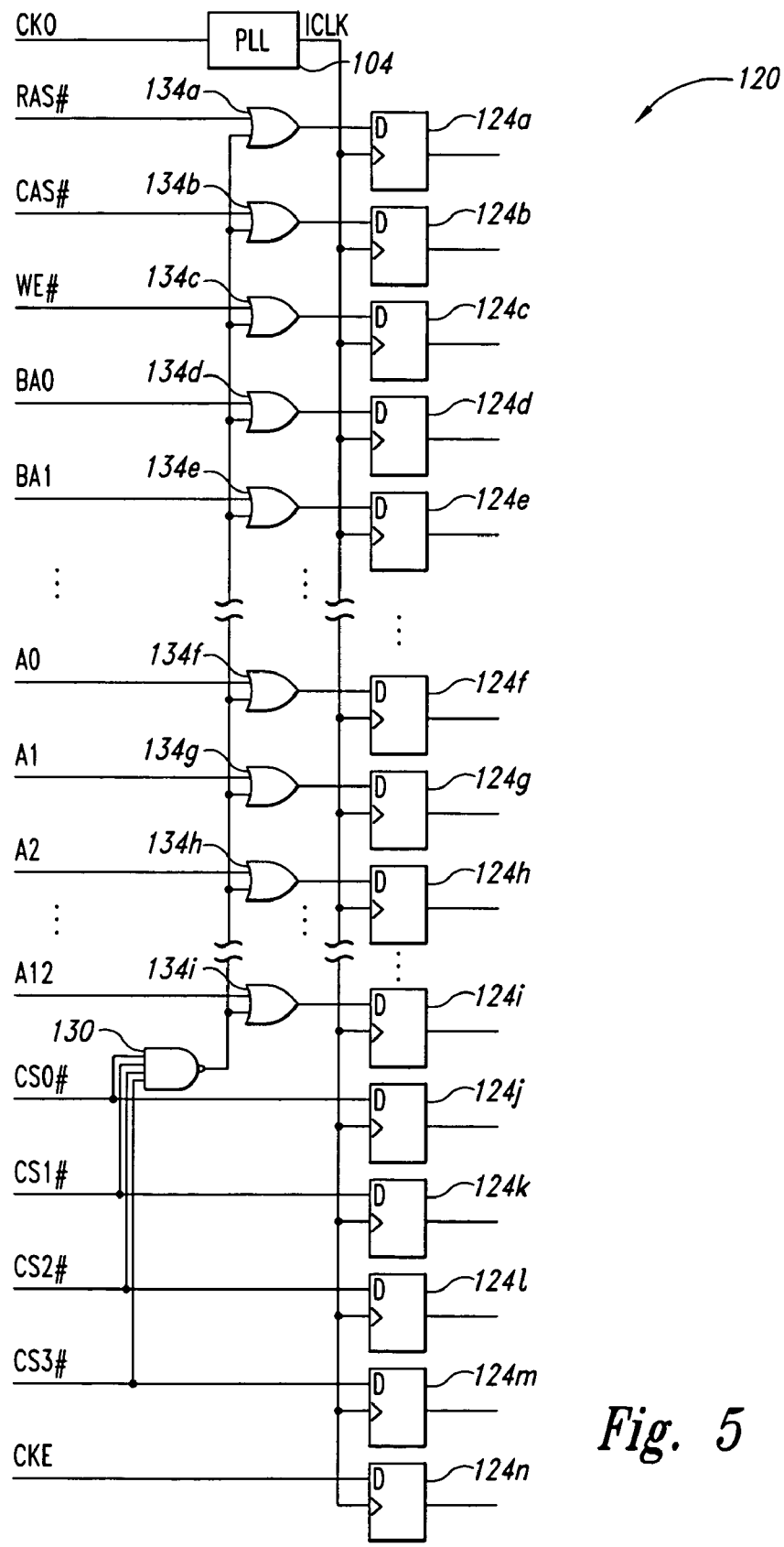
FIG. 5 is a logic diagram of another embodiment of a register used in the registered DRAM module of FIG. 2.

Another embodiment of a register 120 that may be used in the modules 44, 46 is shown in FIG. 5. The register 120 again includes a flip-flop 124 for each of the signals that is applied to the register 120. Each flip-flop 124 includes a data "D" input to which the externally applied signal is coupled and a clock input "C" to which the ICLK signal is coupled. Unlike the flip-flops 110 shown in FIG. 4, the flip-flops 124 do not include a clock enable "CE" input. Instead an enable signal is generated by an AND gate 130 and is used to control OR gates 134 through which most of the input signals are coupled to the D inputs of respective flip-flops 124. However, the four chip select signals CS0#–CS3# are applied directly to their respective flip-flops 124k–124n without passing through respective NOR gates 134. The chip select signals CS0#–CS3# are also applied to respective inputs of the AND gate 130.

In operation, the output of the AND gate 130 will be low to enable the OR gates 134 if any of the chip select signals CS0#–CS3# is active low. Thus, the register 120 will latch the signals applied to its inputs responsive to the ICLK signal from the PLL 104 if any of the SDRAMs 90–96 in the module 44, 46 is selected by the memory controller 80. If none of the chip select signals CS0#–CS3# is active low, all of the inputs to the AND gate 130 will be high, thereby causing the AND gate 130 to apply a high to the OR gates 130. The OR gates 130 are then disabled from coupling the input signals to the D inputs of the flip-flops 124. As a result, the non-enabled register in the modules 44, 46 consumes relatively little power if none of the SDRAMs 90–96 in the modules 44, 46 is selected.

From the foregoing it will be appreciated that, although specific embodiments of the invention have been described herein for purposes of illustration, various modifications may be made without deviating from the spirit and scope of the invention. For example, although the register 108 of FIG. 4 and the register 120 of FIG. 5 include a NAND gate 114 and an AND gate 130, respectively, it will be understood that other logic devices can be alternatively used to decode the chip select signals. Other modifications will be apparent to one skilled in the art. For example, rather than coupling the input signals through an OR gate 134 in the embodiment of FIG. 4, the input signals could be applied directly to the D terminals of the flip-flops 124, and the ICLK signal could instead be coupled to the flip-flops 124 through one of the OR gate 134. Accordingly, the invention is not limited except as by the appended claims.

The invention claimed is:

1. A registered memory module, comprising:
   a register structured to store a plurality of input signals responsive to a transition of an internal clock signal when an enable signal is active, the register further being structured to couple the stored plurality of input signals to respective output terminals;
   a plurality of memory devices coupled to the output terminals of the register; and
   a logic circuit structured to apply the enable signal to the register, the logic circuit being structured to make the enable signal active responsive to one of the memory devices in the memory module being accessed.

2. The registered memory module of claim 1 wherein the logic circuit is further structured to make the enable signal inactive when one of the memory devices in the memory module is not being accessed.

3. The registered memory module of claim 1 wherein the register comprises a plurality of flip-flops each having a data terminal structured to receive a respective one of the input signals and a clock terminal structured to receive the clock signal.

4. The registered memory module of claim 3 wherein each of the flip-flops includes an enable terminal structured to receive the enable signal from the logic circuit, the flip-flops being structured to latch the input signals applied to respective data terminals responsive to the enable signal being active.

5. The registered memory module of claim 1 wherein the logic circuit comprises a NAND gate.

6. The registered memory module of claim 1 wherein the register comprises:
   a plurality of logic gates each having a first input terminal structured to receive a respective one of the input signals and a second input terminal structured to receive the enable signal, each of the logic gates having an output terminal; and
   a plurality of flip-flops each having a data terminal coupled to the output terminal of a respective one of the logic gates and a clock terminal structured to receive the clock signal.

7. The registered memory module of claim 1 wherein each of the memory devices comprise a dynamic random access memory ("DRAM") device.

8. The registered memory module of claim 7 wherein each of the DRAM devices comprise a synchronous DRAM device.

9. The registered memory module of claim 1 wherein the memory module is further structured to receive a clock enable signal, and wherein the register is structured to store the clock enable signal.

10. The registered memory module of claim 1 wherein the input signals comprise address signals.

11. A memory module, comprising:
    a receiver circuit structured to input a plurality of signals responsive to a transition of an internal clock signal applied to a clock terminal when an enable signal is active, the receiver circuit being structured to couple the input signals to respective output terminals when the enable signal is active;
    a plurality of memory devices coupled to the output terminals of the receiver circuit, each of the memory devices being structured to be selected responsive to a respective select signal being active; and
    a logic circuit structured to receive the select signals for the memory devices and to apply the enable signal to the receiver circuit, the logic circuit being structured to make the enable signal active responsive to any of the select signals being active and to make the enable signal inactive response to none of the select signals being active.

12. The memory module of claim 11 wherein the receiver circuit comprises a plurality of flip-flops each having a data terminal structured to receive a respective one of the input signals and a clock terminal structured to receive the clock signal.

13. The memory module of claim 12 wherein each of the flip-flops includes an enable terminal structured to receive the enable signal from the logic circuit, the flip-flops being structured to latch the input signals applied to respective data terminals responsive to the enable signal being active.

14. The memory module of claim 11 wherein the logic circuit comprises a NAND gate.

15. The memory module of claim 11 wherein the receiver circuit comprises:
    a plurality of logic gates each having a first input terminal structured to receive a respective one of the input signals and a second input terminal structured to receive the enable signal, each of the logic gates having an output terminal; and
    a plurality of flip-flops each having a data terminal coupled to the output terminal of a respective one of the logic gates and a clock terminal structured to receive the clock signal.

16. The memory module of claim 11 wherein the logic circuit comprises an ANT) gate.

17. The memory module of claim 11 wherein each of the memory devices comprise a dynamic random access memory ("DRAM") device.

18. The memory module of claim 17 wherein each of the DRAM devices comprise a synchronous DRAM device.

19. The memory module of claim 11 wherein the memory module is further structured to receive a clock enable signal, and wherein the register is structured to store the clock enable signal.

20. The memory module of claim 11 wherein the input signals comprise address signals.

21. The memory module of claim 11 wherein the input signals further comprise the select signals.

22. The memory module of claim 11 wherein the receiver circuit comprises a register that is structured to store the input signals.

23. A memory module, comprising:
a receiver circuit structured to input a plurality of signals responsive to a transition of an internal clock signal applied to a clock terminal when an enable signal is active, the receiver circuit further being a plurality of signals coupled the input signals to respective output terminals when the enable signal is active;
a plurality of memory devices coupled to the output terminals of the receiver circuit; and
a logic circuit a plurality of signals apply the enable signal to the receiver circuit, the logic circuit being structured to make the enable signal active responsive to one of the memory devices in the memory module being accessed.

24. The memory module of claim 23 wherein the logic circuit is further structured to make the enable signal inactive when one of the memory devices in the memory module is not being accessed.

25. The memory module of claim 23 wherein the receiver circuit comprises a plurality of flip-flops each having a data terminal structured to receive a respective one of the input signals and a clock terminal structured to receive the clock signal.

26. The memory module of claim 25 wherein each of the flip-flops includes an enable terminal structured to receive the enable signal from the logic circuit, the flip-flops being structured to latch the input signals applied to respective data terminals responsive to the enable signal being active.

27. The memory module of claim 23 wherein the receiver circuit comprises:
a plurality of logic gates each having a first input terminal structured to receive a respective one of the input signals and a second input terminal structured to receive the enable signal, each of the logic gates having an output terminal; and
a plurality of flip-flops each having a data terminal coupled to the output terminal of a respective one of the logic gates and a clock terminal structured to receive the clock signal.

28. The memory module of claim 23 wherein each of the memory devices comprise a dynamic random access memory ("DRAM") device.

29. The memory module of claim 28 wherein each of the DRAM devices comprise a synchronous DRAM device.

30. The memory module of claim 23 wherein the memory module is further structured to receive a clock enable signal, and wherein the receiver circuit is structured to coupled the clock enable signal to the output terminals of the receiver circuit.

31. The memory module of claim 23 wherein the input signals comprise address signals.

32. The memory module of claim 23 wherein the receiver circuit comprises a register that is structured to store the input signals.

33. A computer system, comprising:
a central processing unit ("CPU");
a system controller coupled to the CPU;
an input device coupled to the CPU through the system controller;
an output device coupled to the CPU through the system controller;
a storage device coupled to the CPU through the system controller; and
at least one registered memory module coupled to the CPU through the system controller, the at least one registered memory module comprising:
a register structured to receive a plurality of input signals at respective input terminals, the register structured to store the input signals responsive to a transition of an internal clock signal applied to a clock terminal when an enable signal is active, the register being structured to coupled the stored input signals to respective output terminals;
a plurality of memory devices coupled to the output terminals of the register; and
a logic circuit structured to apply the enable signal to the register, the logic circuit being structured to make the enable signal active responsive to one of the memory devices in the memory module being accessed.

34. The computer system of claim 33 wherein the logic circuit is further structured to make the enable signal inactive when one of the memory devices in the memory module is not being accessed.

35. The computer system of claim 33 wherein the register comprises a plurality of flip-flops each having a data terminal structured to receive a respective one of the input signals and a clock terminal structured to receive the clock signal.

36. The computer system of claim 35 wherein each of the flip-flops includes an enable terminal structured to receive the enable signal from the logic circuit, the flip-flops being structured to latch the input signals applied to respective data terminals responsive to the enable signal being active.

37. The computer system of claim 33 wherein the logic circuit comprises a NAND gate.

38. The computer system of claim 33 wherein the register comprises:
a plurality of logic gates each having a first input terminal structured to receive a respective one of the input signals and a second input terminal structured to receive the enable signal, each of the logic gates having an output terminal; and
a plurality of flip-flops each having a data terminal coupled to the output terminal of a respective one of the logic gates and a clock terminal structured to receive the clock signal.

39. The computer system of claim 33 wherein each of the memory devices comprise a dynamic random access memory ("DRAM") device.

40. The computer system of claim 39 wherein each of the DRAM devices comprise a synchronous DRAM device.

41. The computer system of claim 33 wherein the memory module is further structured to receive a clock enable signal, and wherein the register is structured to store the clock enable signal.

42. The computer system of claim 33 wherein the input signals comprise address signals.

43. A computer system, comprising:
a central processing unit ("CPU");
a system controller coupled to the CPU;
an input device coupled to the CPU through the system controller;

an output device coupled to the CPU through the system controller;

a storage device coupled to the CPU through the system controller; and at least one memory module coupled to the CPU through the system controller, the at least one memory module comprising:

a receiver structured to coupled a plurality of input signals to respective output terminals responsive to a transition of an internal clock signal applied to a clock terminal when an enable signal is active;

a plurality of memory devices coupled to the output terminals of the receiver, each of the memory devices structured to be selected by a respective select signal being active; and a logic circuit structured to receive the select signals for the memory devices and to apply the enable signal to the register, the logic circuit being structured to make the enable signal active responsive to any of the select signals being active and to make the enable signal inactive response to none of the select signals being active.

44. The computer system of claim 43 wherein the receiver comprises a plurality of flip-flops each having a data terminal structured to receive a respective one of the input signals and a clock terminal structured to receive the clock signal.

45. The computer system of claim 44 wherein each of the flip-flops includes an enable terminal structured to receive the enable signal from the logic circuit, the flip-flops being structured to latch the input signals applied to respective data terminals responsive to the enable signal being active.

46. The computer system of claim 43 wherein the logic circuit comprises a NAND gate.

47. The computer system of claim 43 wherein the receiver comprises:

a plurality of logic gates each having a first input terminal structured to receive a respective one of the input signals and a second input terminal structured to receive the enable signal, each of the logic gates having an output terminal; and a plurality of flip-flops each having a data terminal coupled to the output terminal of a respective one of the logic gates and a clock terminal structured to receive the clock signal.

48. The computer system of claim 43 wherein each of the memory devices comprise a dynamic random access memory ("DRAM") device.

49. The computer system of claim 48 wherein each of the DRAM devices comprise a synchronous DRAM device.

50. The computer system of claim 43 wherein the input signals comprise address signals.

51. The computer system of claim 43 wherein the input signals further comprise the select signals.

* * * * *